United States Patent
Higuchi et al.

(10) Patent No.: US 9,984,903 B2
(45) Date of Patent: May 29, 2018

(54) TREATMENT CUP CLEANING METHOD, SUBSTRATE TREATMENT METHOD, AND SUBSTRATE TREATMENT APPARATUS

(71) Applicant: SCREEN Holdings Co., Ltd., Kyoto (JP)

(72) Inventors: Ayumi Higuchi, Kyoto (JP); Asuka Wakita, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days. days.

(21) Appl. No.: 15/618,394

(22) Filed: Jun. 9, 2017

(65) Prior Publication Data

US 2017/0278724 A1      Sep. 28, 2017

Related U.S. Application Data

(62) Division of application No. 14/492,853, filed on Sep. 22, 2014, now abandoned.

(30) Foreign Application Priority Data

Sep. 27, 2013   (JP) ................................ 2013-202140

(51) Int. Cl.
*H01L 21/67* (2006.01)
*H01L 21/687* (2006.01)

(52) U.S. Cl.
CPC .. *H01L 21/67028* (2013.01); *H01L 21/67051* (2013.01); *H01L 21/68728* (2013.01)

(58) Field of Classification Search
CPC ......... H01L 21/67028; H01L 21/67051; H01L 21/68728
See application file for complete search history.

(56) References Cited

U.S. PATENT DOCUMENTS

| | | | |
|---|---|---|---|
| 5,312,487 A | 5/1994 | Akimoto et al. | 118/52 |
| 6,432,199 B1 | 8/2002 | Takekuma | 118/52 |
| 7,578,887 B2 * | 8/2009 | Kajita | H01L 21/67051 134/18 |
| 2003/0098048 A1 | 5/2003 | Kuroda | 134/32 |
| 2006/0046413 A1 | 3/2006 | Edamoto | 438/366 |
| 2007/0227444 A1 | 10/2007 | Nishide | 118/52 |

(Continued)

FOREIGN PATENT DOCUMENTS

| | | |
|---|---|---|
| JP | 09-232276 | 9/1997 |
| JP | 10-289892 A | 10/1998 |

(Continued)

*Primary Examiner* — Michael Barr
*Assistant Examiner* — Benjamin L Osterhout
(74) *Attorney, Agent, or Firm* — Ostrolenk Faber LLP

(57) ABSTRACT

A treatment cup cleaning method is provided, which includes: a rotating step of rotating a substrate rotating unit with a substrate being held by the substrate rotating unit; a cleaning liquid supplying step of supplying a cleaning liquid to an upper surface and a lower surface of the substrate and causing the cleaning liquid to scatter from a peripheral edge of the substrate to be applied to an inner wall of a treatment cup in the rotating step, whereby the cleaning liquid is supplied to the inner wall of the treatment cup; and a scattering direction changing step of changing a cleaning liquid scattering direction in which the cleaning liquid scatters from the peripheral edge of the substrate in the rotating step and the cleaning liquid supplying step.

1 Claim, 8 Drawing Sheets

(56) References Cited

U.S. PATENT DOCUMENTS

| | | | |
|---|---|---|---|
| 2007/0240824 A1 | 10/2007 | Kaneko | 156/345.11 |
| 2008/0110861 A1* | 5/2008 | Kajita | B08B 3/02 216/83 |
| 2008/0142051 A1* | 6/2008 | Hashizume | H01L 21/67023 134/23 |
| 2008/0189975 A1 | 8/2008 | Miya | 34/317 |
| 2009/0031948 A1 | 2/2009 | Ito | 118/52 |
| 2010/0212701 A1 | 8/2010 | Nanba et al. | 134/95.1 |
| 2012/0153044 A1 | 6/2012 | Ogata | 239/214 |
| 2012/0160278 A1 | 6/2012 | Higashijima | 134/33 |
| 2012/0192899 A1 | 8/2012 | Higashijima | 134/22.1 |
| 2012/0273011 A1* | 11/2012 | Osada | H01L 21/67051 134/33 |
| 2013/0167947 A1 | 7/2013 | Nakano | 137/343 |

FOREIGN PATENT DOCUMENTS

| | | |
|---|---|---|
| JP | 11-283949 A | 10/1999 |
| JP | 2001-015402 A | 1/2001 |
| KR | 10-2012-0121841 A | 11/2012 |
| TW | 200921771 | 5/2009 |

\* cited by examiner

FIG. 2
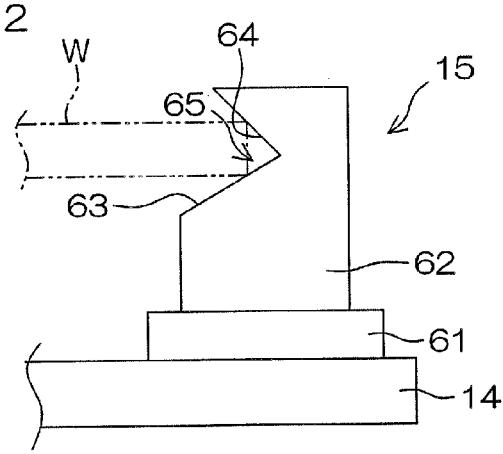
FIG. 3A
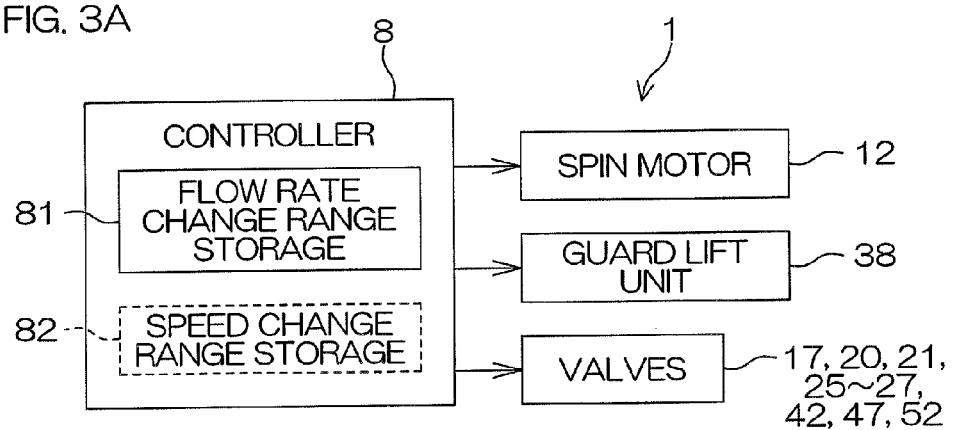
FIG. 3B
|  | UPPER SURFACE SUPPLY FLOW RATE | LOWER SURFACE SUPPLY FLOW RATE | SUPPLY FLOW RATE RATIO |
|---|---|---|---|
| FIRST SUPPLY FLOW RATE COMBINATION | 2.0 L/min | 2.0 L/min | 1 : 1 |
| SECOND SUPPLY FLOW RATE COMBINATION | 2.5 L/min | 1.5 L/min | 1.7 : 1 |
| THIRD SUPPLY FLOW RATE COMBINATION | 3.0 L/min | 1.0 L/min | 3 : 1 |

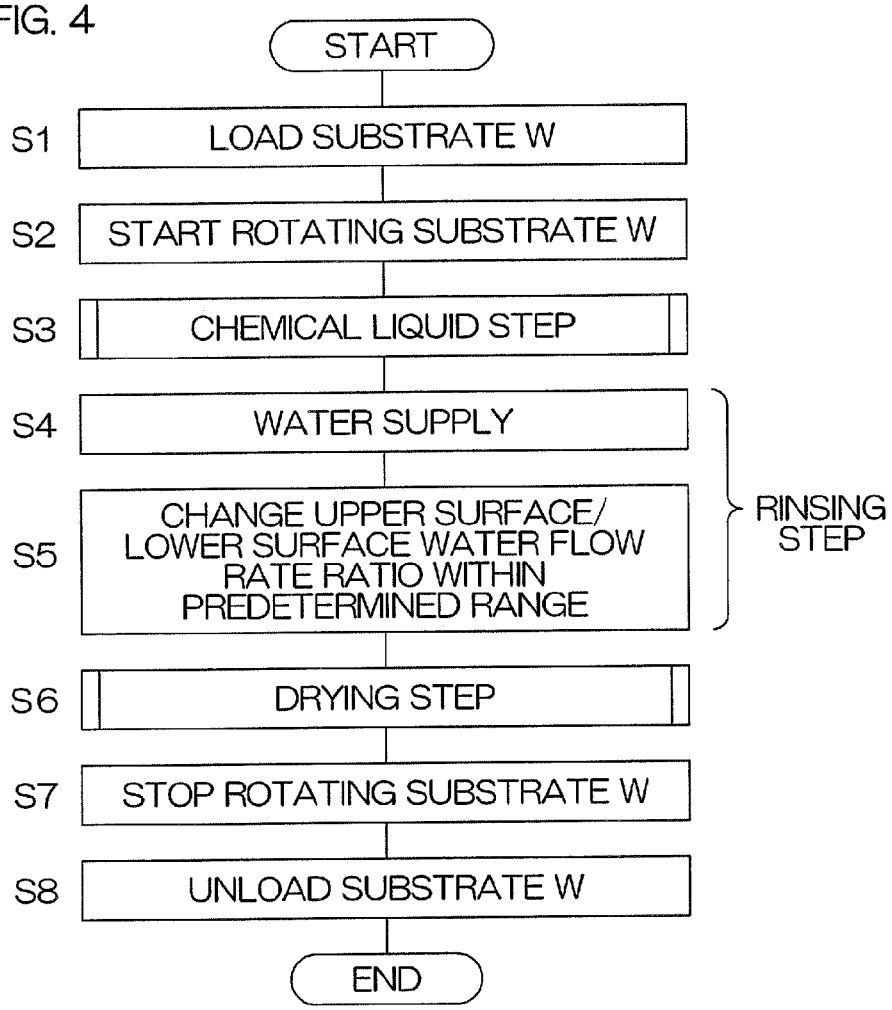
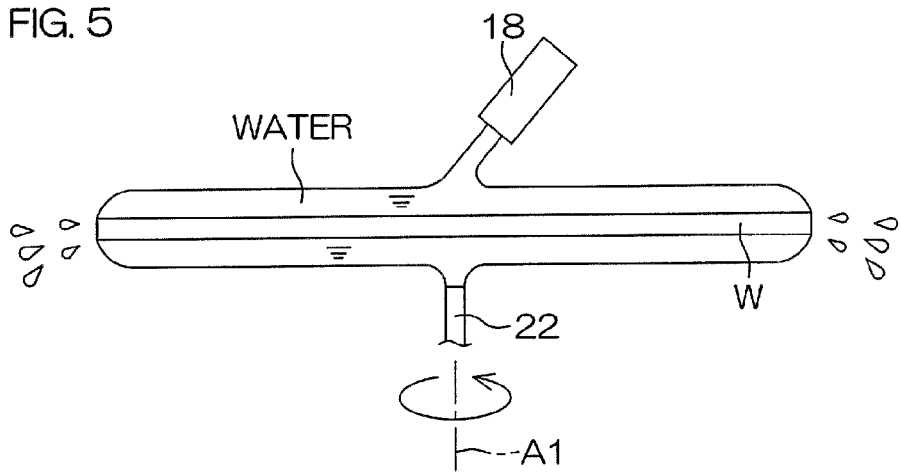

LOWER ROTATION SPEED

HIGHER ROTATION SPEED

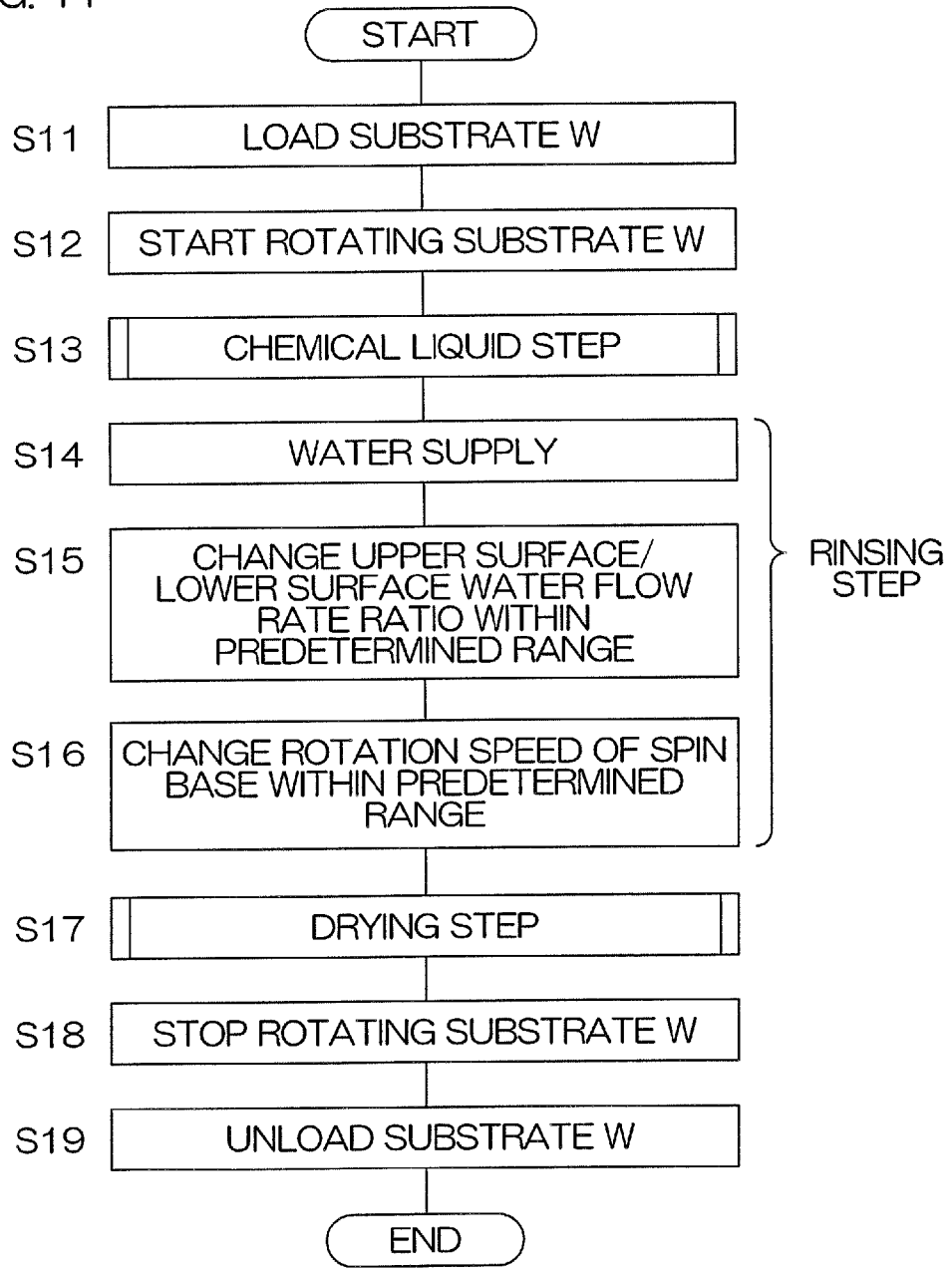

TREATMENT CUP CLEANING METHOD, SUBSTRATE TREATMENT METHOD, AND SUBSTRATE TREATMENT APPARATUS

CROSS REFERENCE TO RELATED APPLICATION

This application is a divisional of U.S. patent application Ser. No. 14/492,853, filed Sep. 22, 2014, which claims the benefit of Japanese Patent Application No. 2013-202140, filed Sep. 27, 2013, which is incorporated herein by reference.

BACKGROUND OF THE INVENTION

1. Field of the Invention

The present invention relates to a treatment cup cleaning method, a substrate treatment method and a substrate treatment apparatus. Exemplary substrates to be treated by the substrate treatment method and the substrate treatment apparatus include semiconductor wafers, substrates for liquid crystal display devices, substrates for plasma display devices, substrates for FED (Field Emission Display) devices, substrates for optical disks, substrates for magnetic disks, substrates for magneto-optical disks, substrates for photo masks, ceramic substrates and substrates for solar cells.

2. Description of Related Art

In production processes for semiconductor devices, liquid crystal display devices and the like, substrates such as semiconductor wafers and substrates for the liquid crystal display devices are treated with a treatment liquid. A substrate treatment apparatus of a single substrate treatment type adapted to treat a single substrate at a time, for example, includes a spin chuck which horizontally holds and rotates the substrate, a nozzle which supplies the treatment liquid to a front surface of the substrate held by the spin chuck, and a bottomed treatment cup which accommodates the spin chuck.

The treatment cup includes a guard having an inner wall which receives treatment liquid scattering around the substrate, and a cup which receives treatment liquid moving down on the inner wall of the guard. The treatment liquid moving on the guard is collected in the cup on a lower edge of the guard.

Where a chemical liquid is used as the treatment liquid, the chemical liquid is liable to be dried to be crystallized on the inner wall of the guard. Problematically, this may result in particles to contaminate the substrate. Therefore, it is desirable to clean the inner wall of the guard with a cleaning liquid to remove substances deposited on the inner wall.

US Patent Application No. 2012/0273011 A1 states that a rotary base of the spin chuck is rotated at a predetermined rotation speed and, in this state, the cleaning liquid is supplied to an upper surface of the rotary base, whereby the inner wall of the treatment guard is cleaned with cleaning liquid scattering from the upper surface of the rotary base. The guard includes a hollow cylindrical portion and an inclination portion provided integrally with the cylindrical portion as extending from an upper edge of the cylindrical portion obliquely upward toward a center axis of the cylindrical portion.

SUMMARY OF THE INVENTION

Where the cleaning liquid is supplied to the upper surface of the rotary base from above, however, the cleaning liquid flowing on the rotary base is liable to be splashed by clamping members of the rotary base, thereby scattering in various directions from a peripheral edge of the rotary base. This makes it difficult to accurately supply the cleaning liquid to an intended portion of the inner wall of the treatment cup, resulting in insufficient cleaning of the inner wall of the treatment cup. This may lead to contamination with particles after the substrate treatment.

It is therefore an object of the present invention to provide a treatment cup cleaning method which ensures extensive and proper cleaning of the inner wall of the treatment cup.

It is another object of the present invention to provide a substrate treatment apparatus and a substrate treatment method which ensure proper treatment of the substrate with the treatment liquid while substantially preventing occurrence of the particles.

According to a first aspect of the present invention, there is provided a treatment cup cleaning method for cleaning a treatment cup which has an inner wall surrounding a substrate rotating unit and captures a treatment liquid scattering from a substrate horizontally held and rotated about a predetermined rotation axis by the substrate rotating unit, the method including: a rotating step of rotating the substrate rotating unit with a substrate being held by the substrate rotating unit; a cleaning liquid supplying step of supplying a cleaning liquid to an upper surface and a lower surface of the substrate and causing the cleaning liquid to scatter from a peripheral edge of the substrate to be applied to the inner wall of the treatment cup in the rotating step, whereby the cleaning liquid is supplied to the inner wall of the treatment cup; and a scattering direction changing step of changing a cleaning liquid scattering direction in which the cleaning liquid scatters from the peripheral edge of the substrate in the rotating step and the cleaning liquid supplying step.

In this method, the cleaning liquid is supplied to both the upper surface and the lower surface of the substrate, whereby the cleaning liquid scattering from the peripheral edge of the substrate is applied to the inner wall of the treatment cup. Thus, the cleaning liquid is supplied to the inner wall. The inner wall of the treatment cup is cleaned with the cleaning liquid thus supplied. Since the cleaning liquid is supplied to both the upper surface and the lower surface of the substrate, the cleaning liquid supplied to the lower surface of the substrate and the cleaning liquid supplied to the upper surface of the substrate interfere with each other on the peripheral edge of the substrate, and scatter in a predetermined scattering direction from the peripheral edge of the substrate.

When the cleaning liquid scattering direction from the peripheral edge of the substrate is changed, a cleaning liquid applying position to which the cleaning liquid is applied on the inner wall of the treatment cup is vertically moved. Therefore, the cleaning liquid scattering direction from the peripheral edge is changed within a predetermined range during the supply of the cleaning liquid to the upper and lower surfaces of the substrate being rotated, whereby the cleaning liquid applying position can be vertically moved on the inner wall of the treatment cup. Thus, the inner wall of the treatment cup can be extensively and properly cleaned. As a result, the chemical liquid is reliably prevented from being dried to be crystallized on the inner wall of the treatment cup.

According to one embodiment of the present invention, the scattering direction changing step includes a flow rate ratio changing step of changing a flow rate ratio between the flow rate of the cleaning liquid being supplied to the upper surface of the substrate and the flow rate of the cleaning liquid being supplied to the lower surface of the substrate (hereinafter referred to as "upper surface/lower surface supply flow rate ratio").

In this method, where the cleaning liquid is supplied to both the upper surface and the lower surface of the substrate, the upper surface/lower surface supply flow rate ratio is changed to change the cleaning liquid scattering direction from the peripheral edge. The cleaning liquid scattering direction is dependent upon the upper surface/lower surface supply flow rate ratio. Therefore, the cleaning liquid applying position can be easily changed on the inner wall of the treatment cup by changing the upper surface/lower surface supply flow rate ratio.

The scattering direction changing step may include a working speed changing step of changing the working speed of the rotation of the substrate rotating unit.

In this method, the rotation speed of the substrate is changed to change the cleaning liquid scattering direction from the peripheral edge. The cleaning liquid scattering direction is dependent upon the rotation speed of the substrate. Therefore, the cleaning liquid applying position can be easily changed on the inner wall of the treatment cup by changing the rotation speed of the substrate.

It is noted that the scattering direction changing step may include both the flow rate ratio changing step of changing the flow rate ratio (upper surface/lower surface supply flow rate ratio) between the flow rate of the cleaning liquid being supplied to the upper surface of the substrate and the flow rate of the cleaning liquid being supplied to the lower surface of the substrate and the working speed changing step of changing the working speed of the rotation of the substrate rotating unit.

The substrate supplied the cleaning liquid in the cleaning liquid supplying step may be a substrate subjected to a predetermined treatment.

The substrate supplied the cleaning liquid in the cleaning liquid supplying step may be a dummy substrate.

According to a second aspect of the present invention, there is provided a substrate treatment method, which includes: a substrate rotating step of rotating a substrate horizontally held by a substrate rotating unit about a predetermined rotation axis; and a treatment liquid supplying step of supplying a treatment liquid to an upper surface and a lower surface of the substrate in the substrate rotating step; wherein the treatment liquid scatters from a peripheral edge of the substrate and is captured by an inner wall of a treatment cup surrounding the substrate rotating unit to be supplied to the inner wall in the treatment liquid supplying step, whereby the inner wall is cleaned with the treatment liquid supplied thereto. The substrate treatment method further includes a scattering direction changing step of changing a treatment liquid scattering direction in which the treatment liquid scatters from the peripheral edge of the substrate in the substrate rotating step and the treatment liquid supplying step.

In this method, the treatment liquid supplied to the upper surface and the lower surface of the substrate and scattering from the peripheral edge of the substrate is applied to the inner wall of the treatment cup. Thus, the treatment liquid is supplied to the inner wall. The inner wall of the treatment cup is cleaned with the treatment liquid thus supplied. Since the treatment liquid is supplied to both the upper surface and the lower surface of the substrate, the treatment liquid supplied to the lower surface of the substrate and the treatment liquid supplied to the upper surface of the substrate interfere with each other on the peripheral edge of the substrate, and scatter in a predetermined scattering direction from the peripheral edge of the substrate.

When the treatment liquid scattering direction from the peripheral edge of the substrate is changed, a treatment liquid applying position to which the treatment liquid is applied on the inner wall of the treatment cup is vertically moved. Therefore, the treatment liquid scattering direction from the peripheral edge is changed within a predetermined range during the supply of the treatment liquid to the upper and lower surfaces of the substrate being rotated, whereby the treatment liquid applying position can be vertically moved on the inner wall of the treatment cup. Thus, the inner wall of the treatment cup can be extensively and properly cleaned. As a result, the chemical liquid is reliably prevented from being dried to be crystallized on the inner wall of the treatment cup. Thus, a substrate treatment method can be provided, which ensures proper treatment of the substrate with the treatment liquid while substantially preventing occurrence of particles.

The treatment liquid supplied to the substrate for the substrate treatment is further supplied to the inner wall of the treatment cup from the peripheral edge of the substrate, and the inner wall of the treatment cup is cleaned with the treatment liquid thus supplied. Therefore, the treatment of the substrate and the cleaning of the treatment cup can be simultaneously carried out with the use of the same treatment liquid. Thus, the productivity of the substrate treatment can be improved (the throughput can be improved) as compared with a case in which the treatment cup is cleaned in a period between treatment processes.

The treatment liquid may include a rinse liquid. In this case, a rinsing operation is performed on the substrate in the treatment liquid supplying step after the substrate is treated with the chemical liquid. After the treatment with the chemical liquid, the chemical liquid is likely to adhere to the inner wall of the treatment cup. However, the treatment cup is cleaned during the rinsing operation performed after the treatment with the chemical liquid. Therefore, the chemical liquid adhering to the inner wall of the treatment cup can be rinsed away with the rinse liquid before being crystallized. Thus, the inner wall can be more advantageously cleaned.

According to a third aspect of the present invention, there is provided a substrate treatment apparatus, which includes: a substrate rotating unit which horizontally holds and rotates a substrate {about a predetermined rotation axis}; a treatment liquid supplying unit which supplies a treatment liquid to the substrate being rotated by the substrate rotating unit; a treatment cup which has an inner wall surrounding the substrate rotating unit and captures treatment liquid scattering from the substrate held by the substrate rotating unit; an upper surface cleaning liquid supplying unit which supplies a cleaning liquid to an upper surface of a substrate being rotated by the substrate rotating unit; a lower surface cleaning liquid supplying unit which supplies the cleaning liquid to a lower surface of the substrate being rotated by the substrate rotating unit; a cleaning liquid flow rate ratio adjusting unit which adjusts a flow rate ratio between the flow rate of the cleaning liquid being supplied from the upper surface cleaning liquid supplying unit and the flow rate of the cleaning liquid being supplied from the lower surface cleaning liquid supplying unit (hereinafter referred to as "upper surface/lower surface supply flow rate ratio"); a cleaning liquid supply controlling unit which controls the substrate rotating unit to rotate the substrate held by the substrate rotating unit, and controls the upper surface cleaning liquid supplying unit and the lower surface cleaning liquid supplying unit to supply the cleaning liquid to the upper surface and the lower surface of the substrate so that the cleaning liquid scatters from a peripheral edge of the substrate to be applied to the inner wall of the treatment cup, whereby the cleaning liquid is supplied to the inner wall of the treatment cup; and a scattering direction change controlling unit which controls at least one of the rotation speed of the substrate rotating unit and the cleaning liquid flow rate ratio adjusting unit to change a cleaning liquid scattering direction in which the cleaning liquid scatters from the peripheral edge of the substrate.

With this arrangement, the cleaning liquid is supplied to both the upper surface and the lower surface of the substrate, whereby the cleaning liquid scattering from the peripheral edge of the substrate is applied to the inner wall of the treatment cup. Thus, the cleaning liquid is supplied to the inner wall. The inner wall of the treatment cup is cleaned with the cleaning liquid thus supplied. Since the cleaning liquid is supplied to both the upper surface and the lower surface of the substrate, the cleaning liquid supplied to the lower surface of the substrate and the cleaning liquid supplied to the upper surface of the substrate interfere with each other on the peripheral edge of the substrate, and scatter in a predetermined scattering direction from the peripheral edge of the substrate.

When the cleaning liquid scattering direction from the peripheral edge of the substrate is changed, a cleaning liquid applying position to which the cleaning liquid is applied on the inner wall of the treatment cup is vertically moved. Therefore, the cleaning liquid scattering direction from the peripheral edge is changed within a predetermined range during the supply of the cleaning liquid to the upper and lower surfaces of the substrate being rotated, whereby the cleaning liquid applying position can be vertically moved on the inner wall of the treatment cup. Thus, the inner wall of the treatment cup can be extensively and properly cleaned. As a result, the chemical liquid is reliably prevented from being dried to be crystallized on the inner wall of the treatment cup. Thus, a substrate treatment apparatus can be provided, which ensures proper treatment of the substrate with the treatment liquid while substantially preventing occurrence of particles.

According to one embodiment of the present invention, the substrate rotating unit includes a rotary base which is rotatable about the rotation axis, and a plurality of substrate holding members provided on a peripheral portion of the rotary base for holding the substrate in abutment against a peripheral surface of the substrate.

With this arrangement, the cleaning liquid supplied to the upper surface of the substrate moves to the peripheral edge on the upper surface and then hits the rotating substrate holding members to scatter around. Further, the cleaning liquid supplied to the lower surface of the substrate moves to the peripheral edge on the lower surface and then hits the rotating substrate holding members to scatter around. The cleaning liquid supplied to the upper surface and the cleaning liquid supplied to the lower surface thus scatter from the peripheral edge of the substrate to interfere with each other on the peripheral edge. Thus, the cleaning liquid can scatter in the predetermined scattering direction from the peripheral edge of the substrate.

The substrate holding members may each include a clamping portion defined by a first abutment surface to be brought into abutment against a lower surface peripheral edge of the substrate and a second abutment surface to be brought into abutment against an upper surface peripheral edge of the substrate. The first abutment surface may be inclined upward radially outward of the substrate with respect to a horizontal plane, and the second abutment surface may be inclined downward radially outward of the substrate with respect to the horizontal plane.

With this arrangement, a cleaning liquid scattering direction in which the cleaning liquid scatters from the lower surface of the substrate after hitting the substrate holding members extends generally along an extension plane of the first abutment surfaces of the respective substrate holding members. That is, the cleaning liquid scattering direction in which the cleaning liquid scatters from the lower surface peripheral edge of the substrate is inclined upward radially outward with respect the horizontal plane. On the other hand, a cleaning liquid scattering direction in which the cleaning liquid scatters from the upper surface of the substrate after hitting the substrate holding members extends generally along an extension plane of the second abutment surfaces of the respective substrate holding members. That is, the cleaning liquid scattering direction in which the cleaning liquid scatters from the upper surface peripheral edge of the substrate is inclined downward radially outward with respect the horizontal plane.

On the peripheral edge of the substrate, the flow of the cleaning liquid scattering from the lower surface peripheral edge of the substrate crosses the flow of the cleaning liquid scattering from the upper surface peripheral edge of the substrate as seen in a vertical plane. Therefore, the cleaning liquid scattering from the lower surface peripheral edge of the substrate and the cleaning liquid scattering from the upper surface peripheral edge of the substrate interfere with each other on the peripheral edge of the substrate. Thus, the cleaning liquid scatters in a cleaning liquid scattering direction which is determined by combining a cleaning liquid scattering direction from the lower surface peripheral edge of the substrate with a cleaning liquid scattering direction from the upper surface peripheral edge of the substrate.

Then, the overall cleaning liquid scattering direction is changed by the scattering direction change controlling unit.

The treatment liquid supplying unit may include an upper surface treatment liquid supplying unit which supplies the treatment liquid to the upper surface of the substrate being rotated by the substrate rotating unit, and a lower surface treatment liquid supplying unit which supplies the treatment liquid to the lower surface of the substrate being rotated by the substrate rotating unit. The upper surface treatment liquid supplying unit may double as the upper surface cleaning liquid supplying unit, and the lower surface treatment liquid supplying unit may double as the lower surface cleaning liquid supplying unit.

The substrate supplied the cleaning liquid by the upper surface cleaning liquid supplying unit and the lower surface cleaning liquid supplying unit may be a substrate subjected to a predetermined treatment.

The substrate supplied the cleaning liquid by the upper surface cleaning liquid supplying unit and the lower surface cleaning liquid supplying unit is a dummy substrate.

The foregoing and other objects, features and effects of the present invention will become more apparent from the following detailed description of the preferred embodiments with reference to the attached drawings.

BRIEF DESCRIPTION OF THE DRAWINGS

FIG. 2 is a side view of a clamping member shown in FIG. 1.

FIG. 3A is a block diagram showing the electrical construction of the substrate treatment apparatus shown in FIG. 1.

FIG. 3B is a diagram showing exemplary data stored in a flow rate change range storage shown in FIG. 3A.

FIG. 4 is a process diagram showing a first exemplary substrate treatment process to be performed by the substrate treatment apparatus shown in FIG. 1.

FIG. 5 is a diagram showing a state of a substrate observed in a rinsing step.

FIG. 11 is a process diagram showing a second exemplary substrate treatment process to be performed by the substrate treatment apparatus shown in FIG. 1.

DETAILED DESCRIPTION OF PREFERRED EMBODIMENTS

Embodiments of the present invention will hereinafter be described in detail with reference to the attached drawings.

Figure 1:
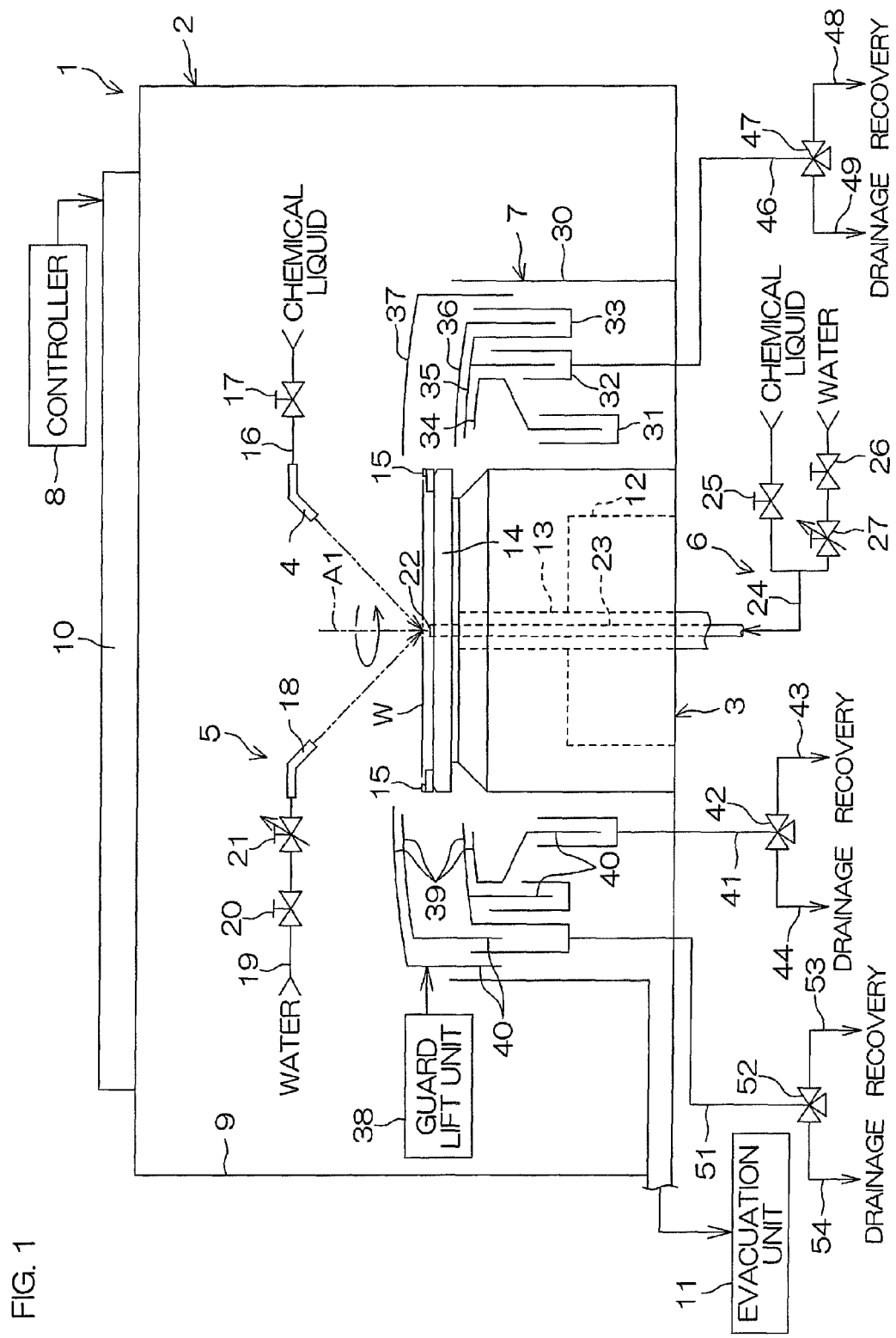
FIG. 1 is a diagram schematically showing the construction of a substrate treatment apparatus according to one embodiment of the present invention.

FIG. 1 is a diagram schematically showing the construction of a substrate treatment apparatus 1 according to one embodiment of the present invention.

The substrate treatment apparatus 1 is of a single substrate treatment type which is adapted to treat a front surface (having a device formation region) of a round substrate W such as a semiconductor wafer with a chemical liquid.

The substrate treatment apparatus 1 includes a spin chuck (substrate rotating unit) 3 which holds and rotates the substrate W, a chemical liquid nozzle 4 which supplies the chemical liquid to the front surface (upper surface) of the substrate W held by the spin chuck 3, a water supply unit (upper surface treatment liquid supplying unit, upper surface cleaning liquid supplying unit) 5 which supplies water as a rinse liquid (treatment liquid) or a cleaning liquid to the front surface (upper surface) of the substrate W held by the spin chuck 3, a lower surface treatment liquid supply unit (lower surface treatment liquid supplying unit, lower surface cleaning liquid supplying unit) 6 which supplies a treatment liquid (chemical liquid or water) to a back surface (lower surface) of the substrate W held by the spin chuck 3, a tubular treatment cup 7 surrounding the spin chuck 3, and a controller (cleaning liquid supply controlling unit, scattering direction change controlling unit) 8 which controls the operations of devices provided in the substrate treatment apparatus 1 and the opening and closing of valves. These components are provided in a treatment chamber 2 of the substrate treatment apparatus 1.

The treatment chamber 2 includes a box-like partition wall 9, an FFU (fan/filter unit) 10 which serves as an air supply unit for supplying clean air to the inside of the partition wall 9 (treatment chamber 2) from above the partition wall 9, and an evacuation unit 11 which expels a gas from the treatment chamber 2 through a bottom of the partition wall 9. The spin chuck 3, the chemical liquid nozzle 4 and a water nozzle 18 of the water supply unit 5 are provided within the partition wall 9.

The FFU 10 is disposed on the partition wall 9, and attached to a ceiling of the partition wall 9. The FFU 10 supplies the clean air into the treatment chamber 2 from the ceiling of the partition wall 9. The evacuation unit 11 is connected to a bottom of the treatment cup 7 to evacuate the inside of the treatment cup 7 from the bottom of the treatment cup 7. The FFU 10 and the evacuation unit 11 cooperatively form a down flow in the treatment chamber 2.

A clamping-type chuck which horizontally clamps the substrate W to hold the substrate W in a horizontal attitude is used as the spin chuck 3. More specifically, the spin chuck 3 includes a spin motor 12, a spin shaft 13 unitary with a drive shaft of the spin motor 12, a disk-shaped rotary base 14 generally horizontally attached to an upper end of the spin shaft 13, and a plurality of clamping members (substrate holding members) 15 (three or more clamping members, e.g., six clamping members) provided on the rotary base 14. The clamping members 15 are disposed on an upper surface peripheral portion of the rotary base 14 as properly spaced circumferentially of the substrate W.

The clamping members 15 cooperatively horizontally clamp the substrate W. When the spin motor 12 is driven in this state, the rotary base 14 is rotated about a predetermined rotation axis (vertical axis) A1 by a driving force of the spin motor 12. Thus, the substrate W is rotated about the rotation axis A1 together with the rotary base 14 in a generally horizontal attitude.

The chemical liquid nozzle 4 is, for example, a straight nozzle which spouts a liquid in the form of continuous stream, and is fixedly disposed above the spin chuck 3 with its spout directed toward around the rotation center of the upper surface of the substrate W. A chemical liquid supply line 16 to which the chemical liquid is supplied from a chemical liquid supply source is connected to the chemical liquid nozzle 4. A first chemical liquid valve 17 which switches on and off the supply of the chemical liquid from the chemical liquid nozzle 4 is provided in the chemical liquid supply line 16. Examples of the chemical liquid to be supplied to the chemical liquid nozzle 4 include liquids containing at least one of sulfuric acid, acetic acid, nitric acid, hydrochloric acid, hydrofluoric acid, BHF (Buffered Hydrogen Fluoride; buffered chemical liquid), ammonia water, hydrogen peroxide water, organic acids (e.g., citric acid, oxalic acid and the like), organic alkalis (e.g., TMAH: tetramethylammonium hydroxide and the like), surface active agents and anticorrosion agents.

The water supply unit 5 includes the water nozzle 18. The water nozzle 18 is, for example, a straight nozzle which spouts a liquid in the form of continuous stream, and is fixedly disposed above the spin chuck 3 with its spout directed toward around the rotation center of the upper surface of the substrate W. A water supply line 19 to which water is supplied from a water supply source is connected to the water nozzle 18. A first water valve 20 which switches on and off the supply of the water from the water nozzle 18 and a first flow rate adjusting valve 21 which adjusts the opening degree of the water supply line 19 to adjust the flow rate of the water to be spouted from the water nozzle 18 are provided in the water supply line 19. Examples of the water to be supplied to the water nozzle 18 include DIW (deionized water), carbonated water, electrolytic ion water, ozone water, a dilute hydrochloric acid aqueous solution (e.g., having a concentration of about 10 to 100 ppm), reduced water (hydrogen water) and degassed water.

The lower surface treatment liquid supply unit 6 includes a lower surface nozzle 22 which spouts the treatment liquid (chemical liquid or water) toward the lower surface (back surface) of the substrate W held by the spin chuck 3, a first treatment liquid supply line 23 vertically extending in the spin shaft 13, and a second treatment liquid supply line 24 connected to the first treatment liquid supply line 23. The chemical liquid is supplied to the second treatment liquid supply line 24 through a second chemical liquid valve 25. Further, water is supplied to the second treatment liquid supply line 24 through a second water valve 26 and a second flow rate adjusting valve 27.

When the second chemical liquid valve 25 is opened with the second water valve 26 being closed, the chemical liquid is supplied to the lower surface nozzle 22 from the first treatment liquid supply line 23 through the second treatment liquid supply line 24. The chemical liquid supplied to the lower surface nozzle 22 is spouted upward from the spout of the lower surface nozzle 22. Thus, the chemical liquid is supplied to a center portion of the lower surface of the substrate W held by the spin chuck 3.

Similarly, when the second water valve 26 is opened with the second chemical liquid valve 25 being closed, the water is supplied to the lower surface nozzle 22 from the first treatment liquid supply line 23 through the second treatment liquid supply line 24. The water supplied to the lower surface nozzle 22 is spouted upward from the spout of the lower surface nozzle 22. Thus, the water is supplied to the lower surface center portion of the substrate W held by the spin chuck 3. The flow rate of the water to be spouted from the lower surface nozzle 22 is regulated by the second flow rate adjusting valve 27.

The chemical liquid nozzle 4 and the water nozzle 18 are not necessarily required to be fixedly disposed with respect to the spin chuck 3, but may be each provided, for example, in the form of a so-called scan nozzle which is attached to an arm pivotal within a horizontal plane above the spin chuck 3 so as to scan a chemical liquid (water) applying position to which the chemical liquid (water) is applied on the upper surface of the substrate W by the pivoting of the arm.

The treatment cup 7 is disposed outward of the substrate W held by the spin chuck 3 (away from the rotation axis A1). The treatment cup 7 includes a tubular member 30 surrounding the spin chuck 3, a plurality of cups 31 to 33 (first to third cups 31 to 33) disposed between the spin chuck 3 and the tubular member 30, a plurality of guards 34 to 37 (first to fourth guards 34 to 37) which receive the treatment liquid scattering around the substrate W, and a guard lift unit 38 which individually moves up and down the guards 34 to 37. The treatment cup 7 is disposed outward of the outer periphery of the substrate W held by the spin chuck 3 (away from the rotation axis A1). In FIG. 1, the treatment cup 7 is illustrated in different states on the right and left sides of the rotation axis A1.

The cups 31 to 33 each have a hollow cylindrical shape, and surround the spin chuck 3 between the spin chuck 3 and the tubular member 30. The second cup 32, which is in the second place from the innermost cup, is disposed outward of the first cup 31, and the third cup 33 is disposed outward of the second cup 32. The third cup 33 is, for example, unitary with the second guard 35, and is moved up and down together with the second guard 35. The cups 31 to 33 each define an annular channel which opens upward.

A first recovery/drainage line 41 is connected to the channel of the first cup 31. The first recovery/drainage line 41 is branched to be connected to a first recovery line 43 and a first drainage line 44 via a first switch valve 42 (e.g., three-way valve). A distal portion of the first recovery line 43 extends to a recovery unit (not shown), and a distal portion of the first drainage line 44 extends to a drainage unit (not shown). A liquid flowing through the first recovery/drainage line 41 is selectively introduced into the first recovery line 43 or the first drainage line 44 by switching the first switch valve 42. Treatment liquid guided to a bottom of the first cup 31 is sent to the recovery unit or the drainage unit through the first recovery/drainage line 41. Thus, treatment liquid flowing from the substrate W is recovered or drained.

A second recovery/drainage line 46 is connected to the channel of the second cup 32. The second recovery/drainage line 46 is branched to be connected to a second recovery line 48 and a second drainage line 49 via a second switch valve 47 (e.g., three-way valve). A distal portion of the second recovery line 48 extends to the recovery unit (not shown), and a distal portion of the second drainage line 49 extends to the drainage unit (not shown). A liquid flowing through the second recovery/drainage line 46 is selectively introduced into the second recovery line 48 or the second drainage line 49 by switching the second switch valve 47. Treatment liquid guided to a bottom of the second cup 32 is sent to the recovery unit or the drainage unit through the second recovery/drainage line 46. Thus, treatment liquid flowing from the substrate W is recovered or drained.

A third recovery/drainage line 51 is connected to the channel of the third cup 33. The third recovery/drainage line 51 is branched to be connected to a third recovery line 53 and a third drainage line 54 via a third switch valve 52 (e.g., three-way valve). A distal portion of the third recovery line 53 extends to the recovery unit (not shown), and a distal portion of the third drainage line 54 extends to the drainage unit (not shown). A liquid flowing through the third recovery/drainage line 51 is selectively introduced into the third recovery line 53 or the third drainage line 54 by switching the third switch valve 52. Treatment liquid guided to a bottom of the third cup 33 is sent to the recovery unit or the drainage unit through the third recovery/drainage line 51. Thus, treatment liquid flowing from the substrate W is recovered or drained.

The guards 34 to 37 each have a hollow cylindrical shape, and surround the spin chuck 3 between the spin chuck 3 and the tubular member 30. The guards 34 to 37 each have a hollow cylindrical guide portion 40 surrounding the spin chuck 3, and a round tubular inclination portion 39 extending from an upper edge of the guide portion 40 obliquely upward toward the center (toward the rotation axis A1 of the substrate W). Upper edges of the inclination portions 39 respectively define inner peripheries of the guards 34 to 37, and each have a greater diameter than the substrate W and the rotary base 14. The four inclination portions 39 are coaxially disposed one over another. Three guide portions 40 (the guide portions 40 of the guards 34 to 36) except the guide portion 40 of the outermost fourth guard 37 are respectively movable in and out of the cups 31 to 33. That is, the treatment cup 7 is collapsible and, therefore, is expanded and collapsed by moving up and down at least one of the four guards 34 to 37 by the guard lift unit 38. The inclination portions 39 may be smoothly arcuately curved upward as indicated in section in FIG. 1, or may extend, for example, linearly.

One of the guards 34 to 37 is opposed to the peripheral surface of the substrate W when the treatment liquid is supplied to the substrate W and when the substrate W is dried. Where the third guard 36 located in the third place from the innermost cup is opposed to the peripheral surface of the substrate W, for example, the first guard 34 and the second guard 35 are located at a lower position (shown on the left side in FIG. 1), and the third guard and the fourth guard 37 are located at an upper position (shown on the left side in FIG. 1). Where the outermost fourth guard 37 is opposed to the peripheral surface of the substrate W, the fourth guard 37 is located at the upper position (shown on the right side in FIG. 1) and the other three guards 34 to 36 are located at the lower position (shown on the right side in FIG. 1).

One of the three guards 34 to 36 except the outermost fourth guard 37 is opposed to the peripheral surface of the substrate W when a chemical liquid step (S3 in FIG. 4) and a rinsing step (S4 and S5 in FIG. 4) to be described later are performed. Therefore, the first guard 34, the second guard 35 or the third guard 36 guides the treatment liquid supplied to the substrate W and scattering around the substrate W to the corresponding one of the cups 31 to 33. The outermost fourth guard 37 is opposed to the peripheral surface of the substrate W, for example, when the substrate W is dried. A drying step (S6 in FIG. 4) to be described later is performed, for example, with the outermost fourth guard 37 being opposed to the peripheral surface of the substrate W. Where the outermost fourth guard 37 is opposed to the peripheral surface of the substrate W, the fourth guard 37 is located at the upper position (shown on the right side in FIG. 1), and the other three guards 34 to 36 are located at the lower position (shown on the right side in FIG. 1).

FIG. 2 is a side view of the clamping member 15. The clamping members 15 each include a base seat 61 provided on the peripheral portion of the rotary base 14, and a cylindrical clamping portion 62 fixed to an upper surface of the base seat 61. The clamping portion 62 has a V-shaped clamping groove provided in an outer peripheral surface thereof as opening horizontally for clamping the peripheral surface of the substrate. The V-shaped clamping groove 65 opens inward (toward the rotation axis A1). The clamping groove 65 is defined by a lower abutment surface (first abutment surface) 63 inclined upward radially outward of the substrate W with respect to a horizontal plane and an upper abutment surface (second abutment surface) 64 inclined downward radially outward of the substrate W with respect to the horizontal plane. The lower abutment surface 63 is inclined at an angle θ1 (see FIG. 6) with respect to the horizontal plane, and the upper abutment surface 64 is inclined at an angle θ2 (see FIG. 6) with respect to the horizontal plane. With the peripheral surface of the substrate W clamped by the clamping grooves 65, a lower edge of the peripheral surface of the substrate W abuts against the lower abutment surface 63, and an upper edge of the peripheral surface of the substrate W abuts against the upper abutment surface 64.

FIG. 3A is a block diagram showing the electrical construction of the substrate treatment apparatus 1.

The controller 8 is configured, for example, to include a microcomputer. The controller 8 controls the operations of the spin motor 12, the guard lift unit 38 and the like according to predetermined programs. The controller 8 further controls the opening/closing operations of the first chemical liquid valve 17, the first water valve 20, the second chemical liquid valve 25, the second water valve 26, the first to third switch valves 42, 47, 52 and the like, and controls the opening degrees of the first and second flow rate adjusting valves 21, 27.

The controller 8 includes a flow rate change range storage 81 which stores the change range of the flow rate of the water to be supplied to the upper surface of the substrate W in the subsequent rinsing step and the change range of the flow rate of the water to be supplied to the lower surface of the substrate W in the subsequent rinsing step.

FIG. 3B is a diagram showing exemplary data stored in the flow rate change range storage 81.

In the rinsing step (S4 and S5 in FIG. 4) to be described later, a flow rate ratio (hereinafter sometimes referred to as "upper surface/lower surface supply flow rate ratio") between the supply flow rate of the water to be supplied to the upper surface of the substrate W (the spouting flow rate of the water to be spouted from the water nozzle 18 (see FIG. 1), hereinafter sometimes referred to as "upper surface supply flow rate") and the flow rate of the water to be supplied to the lower surface of the substrate W (the spouting flow rate of the water to be spouted from the lower surface nozzle 22, hereinafter sometimes referred to as "lower surface supply flow rate") is changed within a predetermined range (Step S5: Flow rate ratio changing step). The change range of the upper surface/lower surface supply flow rate ratio is also stored in the flow rate change range storage 81. More specifically, the upper surface supply flow rate and the lower surface supply flow rate are stored in the flow rate change range storage 81 for use in changing the upper surface/lower surface supply flow rate ratio. The upper surface/lower surface supply flow rate ratio stored in the flow rate change range storage 81 is specified so that a water applying position to which the water is applied on the inner wall of the treatment cup 7 can cover the entire inclination portion 39 (including a distal region $A_U$ (see FIG. 10A), an intermediate region $A_M$ (see FIG. 10B) and a proximal region $A_D$ (see FIG. 10C) as seen in a vertical plane. In the example shown in FIG. 3B, the upper surface supply flow rate and the lower surface supply flow rate are specified so that the total supply flow rate of the water to be supplied to the upper and lower surfaces of the substrate W is 4.0 liters (L)/min.

In the flow rate change range storage 81, the change range of the upper surface/lower surface supply flow rate ratio is set, for example, to a range of 1:1 to 3:1. In a first supply flow rate combination in which the upper surface/lower surface supply flow rate ratio is set to 1:1, the upper surface supply flow rate and the lower surface supply flow rate are each 2.0 (L/min). In a second supply flow rate combination in which the upper surface/lower surface supply flow rate ratio is set to 1.7:1, the upper surface supply flow rate is 2.5 (L/min) and the lower surface supply flow rate is 1.5 (L/min). In a third supply flow rate combination in which the upper surface/lower surface supply flow rate ratio is set to 3:1, the upper surface supply flow rate is 3.0 (L/min) and the lower surface supply flow rate is 1.0 (L/min).

FIG. 4 is a process diagram showing a first exemplary substrate treatment process to be performed by the substrate treatment apparatus 1 Referring to FIGS. 1 to 4, the first exemplary process will hereinafter be described.

In the first exemplary process of FIG. 4, the innermost first guard 34 is opposed to the peripheral surface of the substrate W by way of example and, in this state, chemical liquid is supplied to the substrate W and the rinsing water is supplied to the substrate W.

For the substrate treatment, a transport robot (not shown) is controlled to load an untreated substrate W into the treatment chamber 2 (Step S1). The substrate W is transferred to the spin chuck 3 with its front surface facing up. Prior to the loading of the substrate W, the first to fourth guards 34 to 37 are lowered to the lower position (lowermost position) so as not to prevent the loading and, therefore, the upper edges of the first to fourth guards 34 to 37 are located at a lower level than a substrate holding position at which the substrate W is held by the spin chuck 3.

With the substrate W held by the spin chuck 3, the controller 8 controls the spin motor 12 to start rotating the rotary base 14 to rotate the substrate W (Step S2: Rotating step). The rotation speed of the substrate W is increased to a predetermined liquid treatment speed (in a range of 300 to 1200 rpm, e.g., 1200 rpm), and maintained at the liquid treatment speed.

The controller 8 controls the guard lift unit 38 to move up the first to fourth guards 34 to 37 to the upper position (uppermost position), so that the innermost first guard 34 is opposed to the peripheral surface of the substrate W. In this state, all the guards 34 to 37 are located at the upper position.

When the rotation speed of the substrate W reaches the liquid treatment speed, the controller 8 opens the first chemical liquid valve 17, and opens the second chemical valve 25. Thus, the chemical liquid is spouted from the chemical nozzle 4 toward a center portion of an upper surface of the substrate W, and spouted upward toward a center portion of a lower surface of the substrate W from the spout of the lower surface nozzle 22.

The chemical liquid supplied to the upper surface center portion of the substrate W receives a centrifugal force generated by the rotation of the substrate W to flow toward a peripheral edge of the substrate W on the upper surface of the substrate W. On the other hand, the chemical liquid supplied to the lower surface center portion of the substrate W receives the centrifugal force generated by the rotation of the substrate W to flow toward the peripheral edge of the substrate W on the lower surface of the substrate W. Thus, the chemical liquid is supplied to the entire upper and lower surfaces of the substrate W, whereby the upper and lower surfaces of the substrate W are treated with the chemical liquid (S3: Chemical liquid step). The chemical liquid supplied to the upper and lower surfaces of the substrate W scatters from the peripheral edge of the substrate W laterally of the substrate W.

The chemical liquid scattering from the peripheral edge of the substrate W is received by an inner wall of the first guard 34. Then, the chemical liquid flows down on the inner wall of the guide portion 40 of the first guard 34, and is collected in the bottom of the first cup 31 to be introduced into the first recovery/drainage line 41. At this time, the first recovery/drainage line 41 communicates with the first recovery line 43 via the first switch valve 42, so that the chemical liquid introduced into the first recovery/drainage line 41 is sent to the recovery unit (not shown) through the first recovery line 43.

After a lapse of a predetermined period from the start of the spouting of the chemical liquid, the controller 8 closes the first chemical liquid valve 17 and the second chemical liquid valve 25 to stop spouting the chemical liquid from the chemical liquid nozzle 4 and the lower surface nozzle 22.

Thereafter, the controller 8 opens the first water valve 20 and the second water valve 26, while maintaining the rotation speed of the substrate W at the liquid treatment speed. Thus, the water is supplied from the water nozzle 18 to the upper surface center portion of the substrate W, and supplied from the lower surface nozzle 22 toward the lower surface center portion of the substrate W (S4: Water supplying step (cleaning liquid supplying step)). The state of the substrate W observed at this time is shown in FIG. 5.

The water supplied to the upper surface center portion of the substrate W receives the centrifugal force generated by the rotation of the substrate W to flow toward the peripheral edge of the substrate W on the upper surface of the substrate W as shown in FIG. 5. On the other hand, the water supplied to the lower surface center portion of the substrate W receives the centrifugal force generated by the rotation of the substrate W to flow toward the peripheral edge of the substrate W on the lower surface of the substrate W as shown in FIG. 5. Thus, the upper and lower surfaces of the substrate W are subjected to a rinsing operation, whereby the chemical liquid adhering to the upper and lower surfaces of the substrate W is rinsed away (Rinsing step). The water supplied to the upper and lower surfaces of the substrate W scatters from the peripheral edge of the substrate W laterally of the substrate W.

The water scattering from the peripheral edge of the substrate W is received by the inner wall of the first guard 34. Then, the water flows down on the inner wall of the first guard 34, and is collected in the bottom of the first cup 31 to be introduced into the first recovery/drainage line 41. At this time, the first recovery/drainage line 41 communicates with the first drainage line 44 via the first switch valve 42, so that the water introduced into the first recovery/drainage line 41 is sent to the drainage unit (not shown) through the first drainage line 44.

In the rinsing step, the inner wall of the treatment cup 7 is cleaned simultaneously with the substrate rinsing operation (Step S5). That is, the water scattering from the peripheral edge of the substrate W during the rinsing operation is used as the cleaning liquid for cleaning the inner wall of the first guard 34.

Then, in the rinsing step, the controller 8 changes the upper surface/lower surface supply flow rate ratio, while supplying the water to the upper and lower surfaces of the substrate W. More specifically, the controller 8 controls the opening degrees of the first and second flow rate adjusting valves 21, 27 to adjust the flow rates of the water to be supplied from the water nozzle 18 and the lower surface nozzle 22. Thus, the upper surface/lower surface supply flow rate ratio is changed.

The controller 8 controls the opening degrees of the first and second flow rate adjusting valves 21, 27 with reference to the data stored in the flow rate change range storage 81. That is, the combination of the supply flow rates of the water to be supplied to the upper surface and the lower surface of the substrate W is sequentially changed from the first supply flow rate combination (see FIG. 3B) to the second supply flow rate combination (see FIG. 3B) and then to the third supply flow rate combination (see FIG. 3B). After the third supply flow rate combination, the first supply flow rate combination, the second supply flow rate combination and the third supply flow rate combination may be repeated, or the second supply flow rate combination may be employed. In this case, the change range of the upper surface/lower surface supply flow rate ratio is from 1:1 to 5:1. In this case, the total flow rate of the upper surface supply flow rate and the lower surface supply flow rate is 6.0 liters (L)/min irrespective of the change in upper surface/lower surface supply flow rate ratio.

Figure 6:
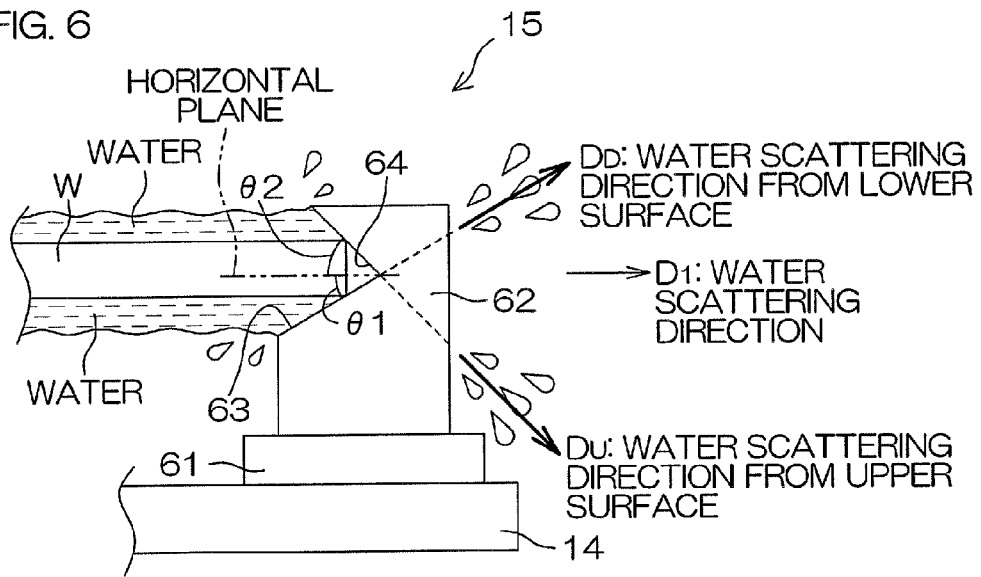
FIG. 6 is a diagram showing a state observed around the clamping member in the rinsing step.

FIG. 6 is a diagram showing a state observed around the clamping member 15 during the water supply in Step S4.

Referring to FIG. 6, the scattering of the water from the peripheral edge of the substrate W will be described.

The water flowing toward the peripheral edge on the upper surface of the substrate W hits the clamping members 15 being rotated together with the rotary base 14 on the peripheral edge of the substrate W to scatter laterally of the substrate W. Similarly, the water flowing toward the peripheral edge on the lower surface of the substrate W hits the clamping members 15 being rotated together with the rotary base 14 on the peripheral edge of the substrate W to scatter laterally of the substrate W. Thus, the water scattering from the peripheral edge of the substrate W mostly hits the clamping members 15 to be forced to further scatter.

The water hitting the clamping members 15 to scatter from the lower surface of the substrate W (hereinafter referred to simply as "the water from the lower surface") generally flows along an extension plane of the lower abutment surfaces 63 of the clamping members 15. That is, the scattering direction $D_D$ of the water from the lower surface is inclined upward radially outward at an angle θ1 with respect to the horizontal plane. On the other hand, the water hitting the clamping members 15 to scatter from the upper surface of the substrate W (hereinafter referred to simply as "the water from the upper surface") generally flows along an extension plane of the upper abutment surfaces 64 of the clamping members 15. That is, the scattering direction $D_U$ of the water from the upper surface is inclined downward radially outward at an angle θ2 with respect to the horizontal plane.

In Step S4, the water is supplied to the upper and lower surfaces of the substrate W, so that the flow of the water scattering from the lower surface peripheral edge of the substrate W crosses the flow of the water scattering from the upper surface peripheral edge of the substrate W on the peripheral edge of the substrate W as seen in a vertical plane. Therefore, the water supplied to the lower surface of the substrate W and the water supplied to the upper surface of the substrate W interfere with each other on the peripheral edge of the substrate W. Then, the water scatters in an overall water scattering direction $D_1$ which is determined by combining the water scattering direction $D_D$ from the lower surface peripheral edge of the substrate W with the water scattering direction $D_U$ from the upper surface peripheral edge of the substrate W.

Figure 7:
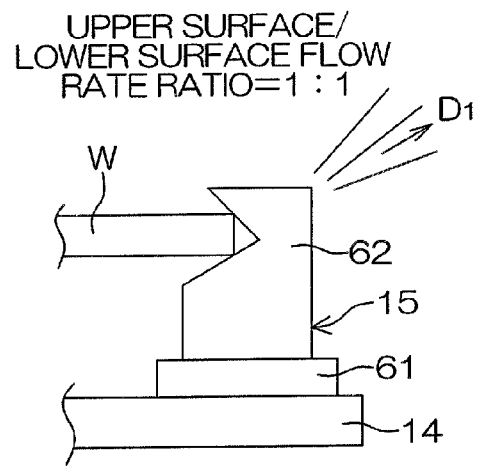
FIGS. 7(a) and 7(b) are diagrams for explaining a change in water scattering direction from a peripheral edge of the substrate where an upper surface/lower surface supply flow rate ratio is changed.
Figure 7:
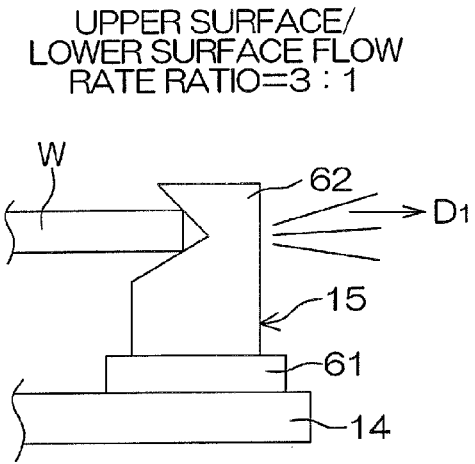

FIGS. 7(a) and 7(b) are diagrams for explaining a change in the water scattering direction $D_1$ from the peripheral edge of the substrate W where the upper surface/lower surface supply flow rate ratio is changed.

FIG. 7(a) shows a water scattering state observed when the upper surface/lower surface supply flow rate ratio is 1:1. In this case, the water from the lower surface scatters obliquely upward as described above, and interferes with the water from the upper surface. However, the flow rate of the water from the upper surface is not so high, failing to sufficiently suppress the scattering of the water flowing obliquely upward from the lower surface. Therefore, the water scattering direction $D_1$ is significantly inclined upward radially outward with respect to the horizontal plane as shown in FIG. 7(a).

On the other hand, FIG. 7(b) shows a water scattering state observed when the upper surface/lower surface supply flow rate ratio is 3:1. In this case, the flow rate of the water from the upper surface is high, making it possible to suppress the scattering of the water flowing obliquely upward from the lower surface. Therefore, the water scattering direction $D_1$ is generally horizontal as shown in FIG. 7(b), or is inclined downward radially outward with respect to the horizontal plane.

The water scattering direction $D_1$ from the peripheral edge of the substrate W is significantly dependent not only on the upper surface/lower surface supply flow rate ratio but also on the rotation speed of the substrate W.

Figure 8:
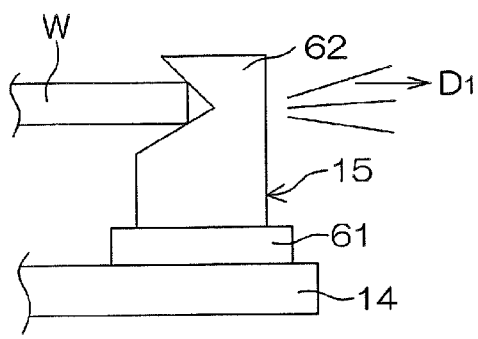
FIGS. 8(a) and 8(b) are diagrams for explaining a change in water scattering direction from the peripheral edge of the substrate where the rotation speed of the substrate is changed.
Figure 8:
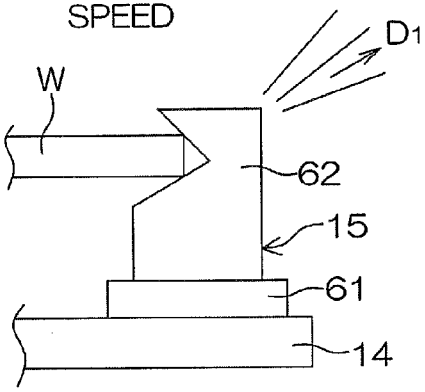

FIGS. 8(a) and 8(b) are diagrams for explaining a change in the water scattering direction $D_1$ from the peripheral edge of the substrate W where the rotation speed of the substrate W is changed.

FIG. 8(a) shows a water scattering state observed when the substrate W is rotated at a lower rotation speed (e.g., 300 rpm). FIG. 8(b) shows a water scattering state observed when the substrate W is rotated at a higher rotation speed (e.g., 1200 rpm). Where the substrate W is rotated at the higher rotation speed, a greater centrifugal force acts on the water on the peripheral edge of the substrate W. Therefore, the water scattering direction $D_1$ is inclined upward radially outward as compared with a case where the substrate W is rotated at the lower rotation speed. The total supply flow rate of the water supplied to the substrate W and the upper surface/lower surface supply flow rate ratio are constant in the cases of FIGS. 8(a) and 8(b).

Figure 9:
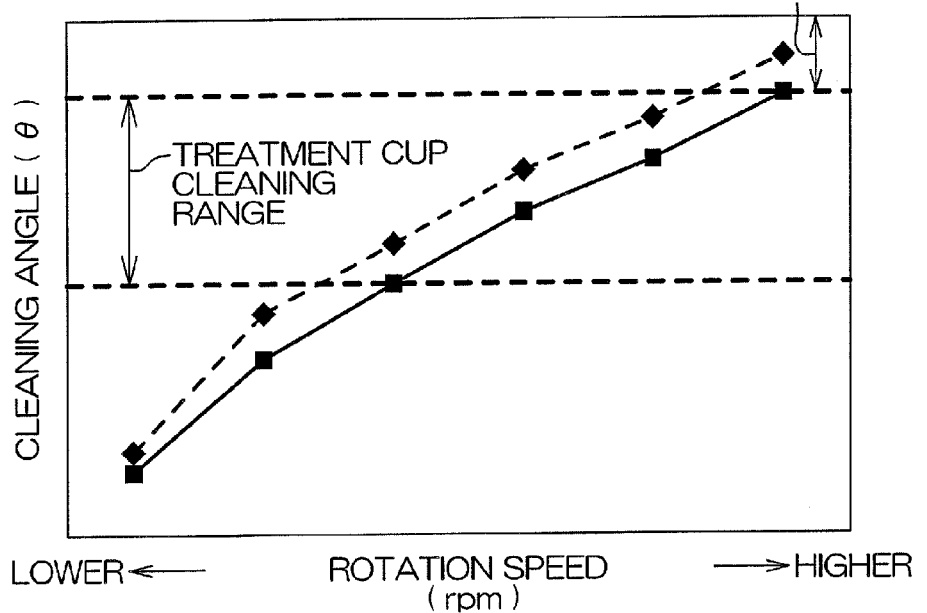
FIG. 9 is a graph showing a relationship between the rotation speed of the substrate and a cleaning angle observed in a vertical plane in a treatment cup.

FIG. 9 is a graph showing a relationship between the rotation speed of the substrate W and the cleaning angle θ observed in a vertical plane in the treatment cup 7. In FIG. 9, Condition 1 is such that the upper surface water supply flow rate and the lower surface water supply flow rate are each 2.0 (L/min), and Condition 2 is such that the upper surface water supply flow rate and the lower surface water supply flow rate are 2.5 (L/min) and 1.5 (L/min), respectively.

FIG. 9 shows that, as the rotation speed increases, the angle (cleaning angle θ) of the water scattering direction $D_1$ (see FIG. 6 and the like) with respect to a predetermined reference plane (e.g., horizontal plane) is increased. Further, FIG. 9 shows that, as the upper surface/lower surface supply flow rate ratio increases (the upper surface supply flow rate increases), the angle (cleaning angle θ) of the water scattering direction $D_1$ with respect to the predetermined reference plane (e.g., horizontal plane) is increased.

Figure 10A:
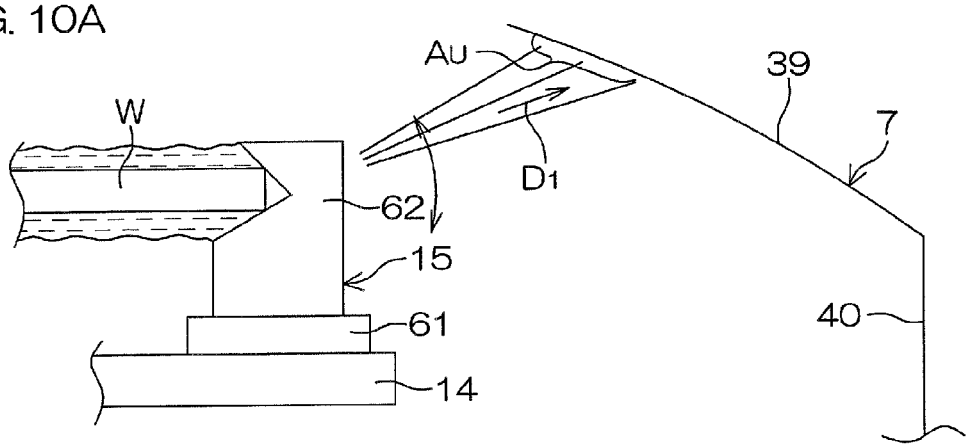
FIGS. 10A to 10C are diagrams showing water scattering states observed in the rinsing step.
Figure 10B:
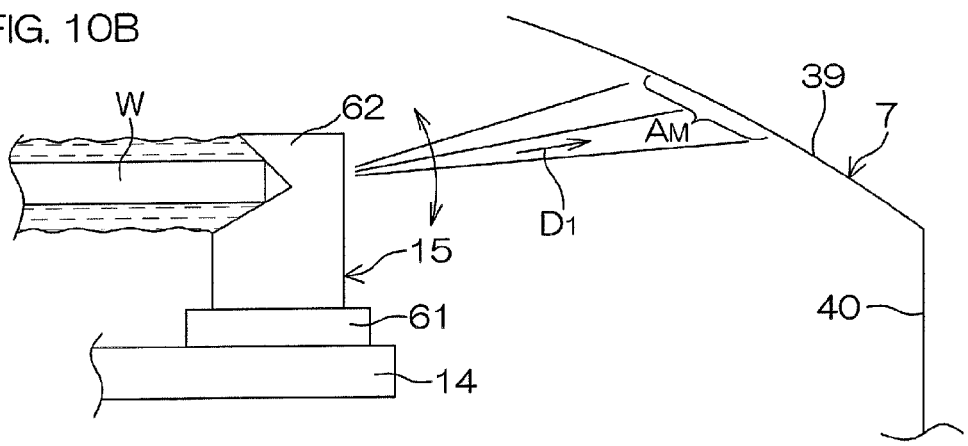
Figure 10C:
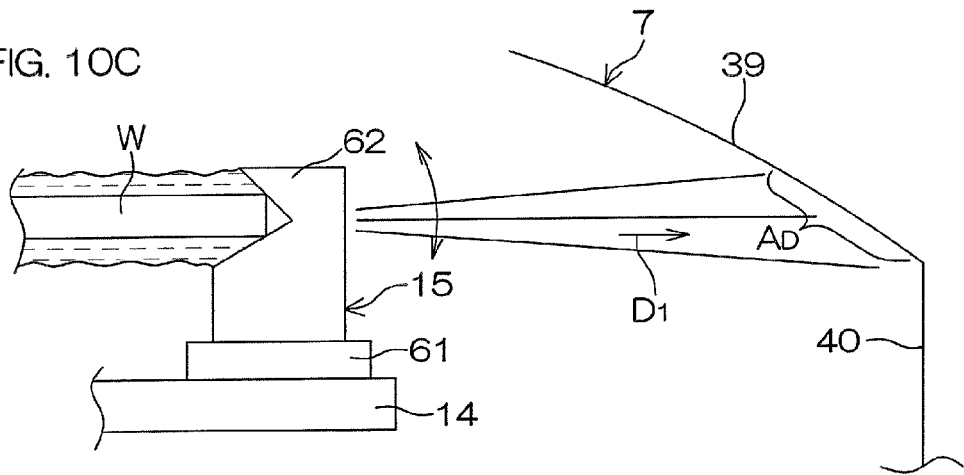

FIGS. 10A to 10C are diagrams showing water scattering states observed in the rinsing step (S4 and S5 in FIG. 4).

In the rinsing step, as described above, the substrate W is rotated at the liquid treatment speed (e.g., 1200 rpm), and the water is supplied to the upper and lower surfaces of the substrate W. In the rinsing step, the controller 8 controls the first and second flow rate adjusting valves 21, 27 based on the data stored in the flow rate change range storage 81 to change the upper surface/lower surface supply flow rate ratio within a range of 1:1 to 5:1 (S5 in FIG. 5), while the water is supplied to the upper and lower surfaces of the substrate W.

Where the combination of the supply flow rates for the upper and lower surfaces of the substrate W is the first supply flow rate combination (the upper surface/lower surface supply flow rate ratio is 1:1), the water scattering from the peripheral edge of the substrate W is applied to the distal region $A_U$ of the inner wall of the inclination portion 39 of the first guard 34 as shown in FIG. 10A Where the combination of the supply flow rates for the upper and lower surfaces of the substrate W is the second supply flow rate combination (the upper surface/lower surface supply flow rate ratio is 1.7:1), the water scattering from the peripheral edge of the substrate W is applied to the intermediate region $A_M$ of the inner wall of the inclination portion 39 of the first guard 34 as shown in FIG. 10B.

Where the combination of the supply flow rates for the upper and lower surfaces of the substrate W is the third supply flow rate combination (the upper surface/lower surface supply flow rate ratio is 3:1), the water scattering from the peripheral edge of the substrate W is applied to the proximal region $A_D$ of the inner wall of the inclination portion 39 of the first guard 34 or an upper edge portion of the guide portion 40 of the first guard 34 as shown in FIG. 10C.

In the rinsing step, therefore, the water can be applied to substantially the entire inclination portion 39 of the first guard 34. Thus, substantially the entire inclination portion 39 of the first guard 34 can be advantageously cleaned.

After a lapse of a predetermined period from the start of the spouting of the water, as shown in FIG. 4, the controller 8 closes the first water valve 20 and the second water valve 26, and controls the guard lift unit 38 to lower the first to third guards 34 to 36 to the lower position while maintaining the fourth guard 37 at the upper position. Thus, the outermost fourth guard 37 is opposed to the peripheral surface of the substrate W. In this state, the first to third guards 34 to 36 are located at the lower position, and the fourth guard 37 is located at the upper position. The water scattering around the substrate W by the higher speed rotation of the substrate W is received by the fourth guard 37, and then guided to the bottom of the tubular member 30 to be sent to the drainage unit (not shown) from the bottom of the tubular member 30.

Further, the controller 8 increases the rotation speed of the substrate W to a spin dry speed (e.g., 2500 rpm). Thus, the water adhering to the substrate W is spun off around the substrate W by a centrifugal force, whereby the substrate W is dried (Step S6).

After the drying step (S6) is performed for a predetermined period, the controller 8 controls the spin motor 12 to stop rotating the spin chuck 3 (to stop rotating the substrate W) (Step S7). Thus, the cleaning process for the single substrate W is completed. The controller 8 controls the guard lift unit 38 to lower the first to fourth guards 34 to 37 to the lower position (lowermost position).

Thereafter, the transport robot unloads the treated substrate W from the treatment chamber 2 (Step S8).

According to this embodiment, as described above, the water is supplied to both the upper surface and the lower surface of the substrate W, whereby the water scattering from the peripheral edge of the substrate W is applied to the inner wall of the treatment cup 7. Thus, the water is be supplied to the inner wall. The inner wall of the treatment cup 7 is cleaned with the water thus supplied. Since the water is supplied to both the upper surface and the lower surface of the substrate W, the water supplied to the lower surface of the substrate W and the water supplied to the upper surface of the substrate W interfere with each other on the peripheral edge of the substrate W. Therefore, the water scatters in the overall water scattering direction $D_1$ determined by combining the water scattering direction $D_D$ from the lower surface peripheral edge of the substrate W with the water scattering direction $D_U$ from the upper surface peripheral edge of the substrate W.

The upper surface/lower surface supply flow rate ratio is changed, while the water is supplied to the upper and lower surfaces of the substrate W being rotated. Thus, the water scattering direction $D_1$ can be changed, whereby the water applying position can be moved up and down on the inner wall of the treatment cup 7. Therefore, the inner wall of the treatment cup 7 can be extensively and properly cleaned. As a result, the chemical liquid is reliably prevented from being dried to be crystallized on the inner wall of the treatment cup 7. This makes it possible to advantageously perform the process sequence on the substrate W, while substantially preventing occurrence of particles.

Since the water supplied to the substrate W for the rinsing operation is supplied to the inner wall of the treatment cup 7 from the peripheral edge of the substrate W and the inner wall of the treatment cup 7 is cleaned with the water thus supplied, the treatment cup 7 cleaning process can be performed in the rinsing step (S4 and S5 in FIG. 4). Thus, the productivity of the substrate treatment can be improved (the throughput can be improved) as compared with a case in which the treatment cup 7 is cleaned in a period between treatment processes.

After the treatment with the chemical liquid, the chemical liquid is likely to adhere to the inner wall of the treatment cup. However, the treatment cup 7 can be cleaned in the rinsing step (S4 and S5 in FIG. 4) performed subsequently to the chemical liquid step (S3 in FIG. 4). Therefore, the chemical liquid adhering to the inner wall of the treatment cup 7 can be rinsed away with the water before being crystallized. Thus, the inner wall of the treatment cup 7 can be further advantageously cleaned.

FIG. 11 is a process diagram showing a second exemplary substrate treatment process to be performed by the substrate treatment apparatus 1

The second exemplary substrate treatment process differs from the first exemplary substrate treatment process shown in FIG. 4 in that, while the water is supplied to the upper and lower surfaces of the substrate W in the rinsing step (Steps S14, S15 and S16), the upper surface/lower surface supply flow rate ratio is changed (Step S15) and, in addition, the rotation speed of the rotary base 14 (i.e., the rotation speed of the substrate W) is changed (Step S16).

Steps S11 to S13 shown in FIG. 11 respectively correspond to Steps S1 to S3 shown in FIG. 4, and Steps S17 to S19 shown in FIG. 11 respectively correspond to Steps S6 to S8 shown in FIG. 4. Therefore, duplicate description will be omitted.

More specifically, the controller 8 includes a speed change range storage 82 (indicated by a broken line in FIG. 3) in which the change range of the rotation speed of the rotary base 14 (i.e., the rotation speed of the substrate W) in the rinsing step is stored. Rotation speeds to be employed when the rotation speed of the rotary base 14 is changed are stored in the speed change range storage 82.

In this case, the upper surface/lower surface supply flow rate ratios and the rotation speeds of the rotary base 14 respectively stored in the flow rate change range storage 81 and the speed change range storage 82 are specified so that the water applying position on the inner wall of the treatment cup 7 can cover the entire inclination portion 39 (including the distal region $A_U$ (see FIG. 10A), the intermediate region $A_M$ (see FIG. 10B) and the proximal region $A_D$ (see FIG. 10C) as seen in a vertical plane.

More specifically, the change range of the upper surface/lower surface supply flow rate ratio stored in the flow rate change range storage 81 is from 1:1 to 17:1, and the change range of the rotation speed of the rotary base 14 stored in the speed change range storage 82 is from 800 to 1200 rpm. A plurality of combinations of the supply flow rates for the upper and lower surfaces of the substrate W and the rotation speed of the rotary base 14 include a first combination with an upper surface supply flow rate of 2.0 (L/min), a lower surface supply flow rate of 2.0 (L/min) and a rotary base rotation speed of 1200 rpm, a second combination with an upper surface supply flow rate of 2.25 (L/min), a lower surface supply flow rate of 1.75 (L/min) and a rotary base rotation speed of 1000 rpm, and a third combination with an upper surface supply flow rate of 2.5 (L/min), a lower surface supply flow rate of 1.5 (L/min) and a rotary base rotation speed of 800 rpm.

The controller 8 controls the opening degrees of the first and second flow rate adjusting valves 21, 27 and the spin motor 12 with reference to the data stored in the flow rate change range storage 81 and the speed change range storage 82. The combination of the supply flow rates for the upper and lower surfaces of the substrate W and the rotation speed of the rotary base 14 is sequentially changed from the first combination to the second combination and then to the third combination.

Where the combination of the supply flow rates for the upper and lower surfaces of the substrate W and the rotation speed of the rotary base 14 is the first combination, the water scattering from the peripheral edge of the substrate W is applied to the distal region $A_U$ of the inner wall of the inclination portion 39 of the first guard 34 as in the case shown in FIG. 10A.

Where the combination of the supply flow rates for the upper and lower surfaces of the substrate W and the rotation speed of the rotary base 14 is the second combination, the water scattering from the peripheral edge of the substrate W is applied to the intermediate region $A_M$ of the inner wall of the inclination portion 39 of the first guard 34 as in the case shown in FIG. 10B.

Where the combination of the supply flow rates for the upper and lower surfaces of the substrate W and the rotation speed of the rotary base 14 is the third combination, the water scattering from the peripheral edge of the substrate W is applied to the proximal region $A_D$ of the inner wall of the inclination portion 39 of the first guard 34 or the upper edge portion of the guide portion 40 of the first guard 34 as in the case shown in FIG. 10C.

In the rinsing step (S14 to S16), therefore, the water can be applied to substantially the entire inclination portion 39 of the first guard 34. Thus, substantially the entire inclination portion 39 of the first guard 34 can be advantageously cleaned.

In the second exemplary process, not only the upper surface/lower surface supply flow rate ratio but also the rotation speed of the rotary base 14 (i.e., the rotation speed of the substrate W) is changed, while the water is supplied to the upper and lower surfaces of the substrate W. Thus, the water scattering direction $D_1$ is changed, whereby the water applying position is moved up and down on the inner wall of the treatment cup 7.

Figure 12:
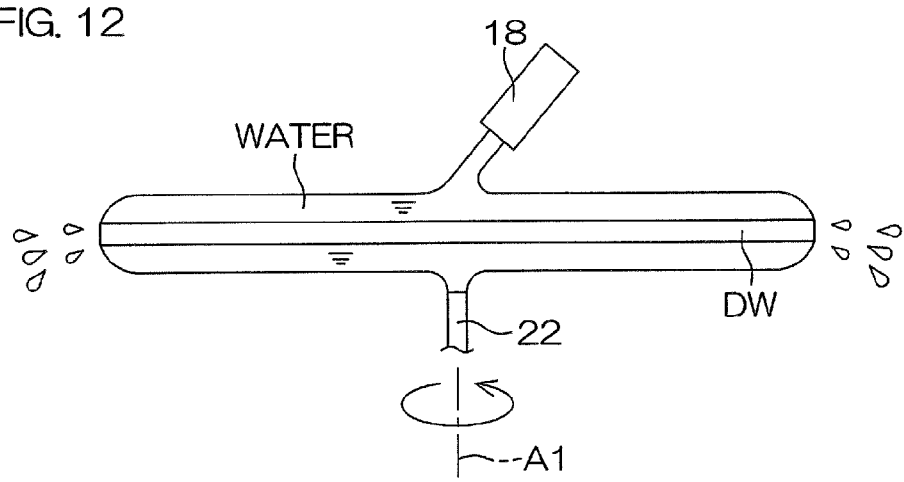
FIG. 12 is a diagram showing a cup cleaning process to be performed in a substrate treatment apparatus according to another embodiment of the present invention.
Figure 13:
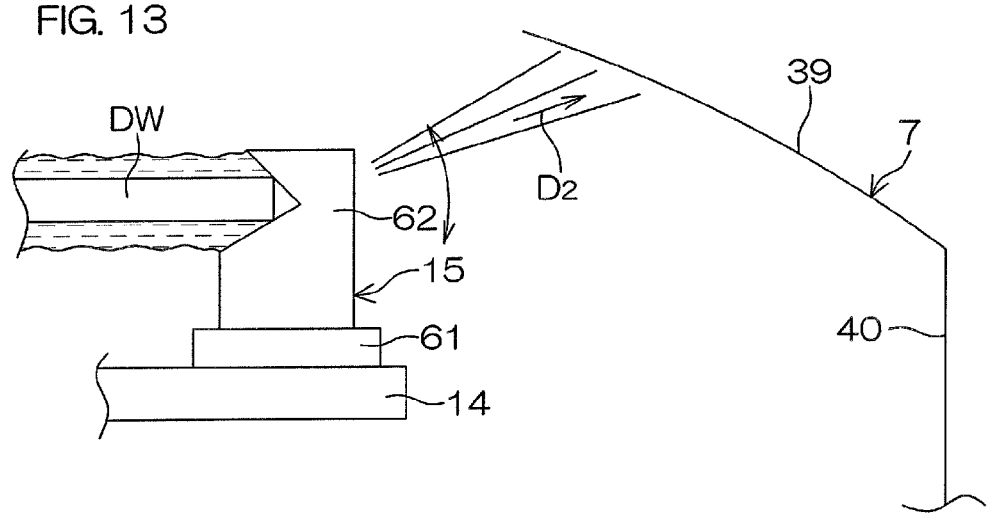
FIG. 13 is a diagram showing a water scattering state observed in the cup cleaning process.

FIG. 12 is a diagram showing a cup cleaning process to be performed in a substrate treatment apparatus according to a second embodiment of the present invention. FIG. 13 is a diagram showing a water scattering state observed in the cup cleaning process.

The substrate treatment apparatus according to the second embodiment has the same construction as the substrate treatment apparatus 1. In the substrate treatment apparatus according to the second embodiment, the treatment cup 7 (see FIG. 1 is cleaned when the process sequence for the substrate treatment with the use of the treatment liquid is not performed. Every time the treatment of one lot of substrates W is finished, a cup cleaning process to be described below is performed. Referring to FIGS. 1 to 3 and FIG. 4, the cup cleaning process will be described.

In this cup cleaning process, a round dummy substrate DW such as of SiC is held by the spin chuck 3. Then, the controller 8 controls the guard lift unit 38 so that a guard to be cleaned (in the preceding embodiment, the innermost first guard 34 which is opposed to the peripheral surface of the substrate W in the chemical liquid step) is brought into opposed relation to a peripheral surface of the dummy substrate DW. Further, as shown in FIG. 12, the controller 8 rotates the dummy substrate DW at a predetermined rotation speed (e.g., 1200 rpm), and spouts the water from the water nozzle 18 and the lower surface nozzle 22 to supply the water to center portions of upper and lower surfaces of the dummy substrate DW.

The water supplied to the upper and lower surfaces of the dummy substrate DW receives a centrifugal force generated by the rotation of the dummy substrate DW to flow toward a peripheral edge of the dummy substrate DW. On the peripheral edge of the dummy substrate DW, the flow of the water scattering from a lower surface peripheral edge of the dummy substrate DW crosses the flow of the water scattering from an upper surface peripheral edge of the dummy substrate DW as seen in a vertical plane. Therefore, the water supplied to the lower surface of the dummy substrate DW and the water supplied to the upper surface of the dummy substrate DW interfere with each other, and scatter from the peripheral edge of the dummy substrate DW in a scattering direction $D_2$ (see FIG. 13). The water scattering from the peripheral edge of the dummy substrate DW is applied to the inner wall of the first guard 34 to be received by the inner wall. The inner wall of the treatment cup 7 is cleaned with the water thus supplied to the inner wall of the first guard 34.

In the cup cleaning process, the water supply flow rate ratio between the water supply flow rate for the upper surface of the dummy substrate DW and the water supply flow rate for the lower surface of the dummy substrate DW (upper surface/lower surface supply flow rate ratio) is changed, while the water is supplied to the upper and lower surfaces of the dummy substrate W. More specifically, the controller 8 controls the opening degrees of the first and second flow rate adjusting valves 21, 27 to adjust the flow rates of the water to be supplied from the water nozzle 18 and the lower surface nozzle 22. Thus, the upper surface/lower surface supply flow rate ratio is changed. Specifically, the upper surface/lower surface supply flow rate ratio can be changed in the same manner as in the rinsing step (S4 and S5 in FIG. 4) in the first embodiment described above.

The water scattering direction $D_2$ can be changed by changing the upper surface/lower surface supply flow rate ratio while supplying the water (cleaning liquid) to the upper and lower surfaces of the dummy substrate DW being rotated. Thus, the water applying position can be moved up and down on the inner wall of the treatment cup 7. Therefore, the inner wall of the treatment cup 7 can be extensively and properly cleaned as in the embodiment described with reference to FIGS. 1 to 11. As a result, the chemical liquid is reliably prevented from being dried to be crystallized on the inner wall of the treatment cup 7.

After a lapse of a predetermined period from the start of the water supply to the dummy substrate DW, the controller 8 closes the first water valve 20 and the second water valve 26, and controls the spin motor 12 to stop rotating the dummy substrate DW. The controller 8 controls the guard lift unit 38 to lower the first to fourth guards 34 to 37 to the lower position (lowermost position). The used dummy substrate DW is thereafter unloaded from the treatment chamber 2 by the transport robot, and accommodated in a dummy substrate retaining portion (not shown).

In the embodiment shown in FIGS. 12 and 13, the water scattering direction $D_2$ may be changed in the cup cleaning process by changing not only the upper surface/lower surface supply flow rate ratio but also the rotation speed of the rotary base 14 (i.e., the rotation speed of the dummy substrate DW) while supplying the water to the upper and lower surfaces of the substrate W as in the second exemplary process described above.

While the two embodiments of the present invention have thus been described, the invention may be embodied in other ways.

In the rinsing step (S4 and S5 in FIG. 4 and S14 to S16 in FIG. 11) and the cup cleaning process in the embodiments described above, for example, only the rotation speed of the rotary base 14 (i.e., the rotation speed of the substrate W or the dummy substrate DW) may be changed to change the water scattering direction $D_1$, $D_2$.

In the rinsing step (S4 and S5 in FIG. 4 and S14 to S16 in FIG. 11) and the cup cleaning process in the embodiments described above, the total water supply flow rate of the upper surface supply flow rate and the lower surface supply flow rate is constant. However, the total water supply flow rate may be changed in the rinsing step and the cup cleaning process.

In the embodiments described above, the same guard (first guard 34) is opposed to the peripheral surface of the substrate W in the chemical liquid step and in the rinsing step by way of example. In the embodiment shown in FIGS. 12 and 13, however, the water (cleaning liquid) scattering from the dummy substrate DW may be supplied to any of the guards 34 to 37 which is dedicated for use in the chemical liquid step. Where the rinsing step (corresponding to S4 in FIG. 4) is performed with the first guard 34 being opposed to the peripheral surface of the substrate W and the chemical liquid step (S3 in FIG. 4) is performed with the second guard 35 being opposed to the peripheral surface of the substrate W, for example, the inner wall of the second guard 35 (dedicated for use in the chemical liquid step) can be cleaned with the water scattering from the dummy substrate DW with the second guard 35 being opposed to the peripheral surface of the dummy substrate DW in the cup cleaning process.

In the embodiments described above, the inner wall of the first guard 34 is cleaned with the water scattering from the substrate W or the dummy substrate DW by way of example, but the cup cleaning method described above may be employed for cleaning the inner walls of the second to fourth guards 35 to 37.

In the embodiment shown in FIGS. 12 and 13, not only the water but also a cleaning chemical liquid (e.g., SC1 (a liquid mixture of $NH_4OH$ and $H_2O_2$) may be used as the cleaning liquid.

It is noted that various design modifications may be made within the scope of the present invention defined by the appended claims.

While the present invention has been described in detail by way of the embodiments thereof, it should be understood that these embodiments are merely illustrative of the technical principles of the present invention but not limitative of the invention. The scope of the present invention are to be limited only by the appended claims.

This application corresponds to Japanese Patent Application No. 2013-202140 filed in the Japan Patent Office on Sep. 27, 2013, the disclosure of which is incorporated herein by reference in its entirety.

What is claimed is:

1. A treatment cup cleaning method for cleaning a treatment cup which has an inner wall surrounding a substrate rotating unit and captures a treatment liquid scattering from a substrate horizontally held and rotated about a predetermined rotation axis by the substrate rotating unit, the method comprising:
    a rotating step of rotating the substrate rotating unit with a substrate being held by the substrate rotating unit;
    a cleaning liquid supplying step of supplying a cleaning liquid to an upper surface and a lower surface of the substrate and causing the cleaning liquid to scatter from a peripheral edge of the substrate to be applied to the inner wall of the treatment cup in the rotating step, whereby the cleaning liquid is supplied to the inner wall of the treatment cup; and
    a scattering direction changing step of changing a cleaning liquid scattering direction in which the cleaning liquid scatters from the peripheral edge of the substrate in the rotating step and the cleaning liquid supplying step;
    wherein the scattering direction changing step includes a flow rate ratio changing step of changing a flow rate ratio between a flow rate of the cleaning liquid being supplied to the upper surface of the substrate and a flow rate of the cleaning liquid being supplied to the lower surface of the substrate.

* * * * *